United States Patent [19]
Seki

[11] Patent Number: 4,730,128
[45] Date of Patent: Mar. 8, 1988

[54] BIAS CIRCUIT FOR AN AVALANCHE PHOTODIODE

[75] Inventor: Yoshihito Seki, Musashino, Japan

[73] Assignee: Iwatsu Electric Co., Ltd., Tokyo, Japan

[21] Appl. No.: 904,274

[22] Filed: Sep. 8, 1986

[30] Foreign Application Priority Data

Oct. 1, 1985 [JP] Japan ................. 60-218896

[51] Int. Cl.[4] .............. H03K 3/26; H03K 3/42; H01L 32/14
[52] U.S. Cl. .................. 307/310; 307/311; 307/491; 250/214 C
[58] Field of Search ............ 307/310, 296 L, 311, 307/451; 350/533, 331 T; 250/214 C

[56] References Cited

U.S. PATENT DOCUMENTS

| | | | |
|---|---|---|---|
| 3,835,313 | 9/1974 | Stiefelmeyer et al. | 250/214 C |
| 3,872,301 | 3/1975 | Joppich | 250/214 C |
| 3,911,268 | 10/1975 | Mori et al. | 250/214 C |
| 4,118,621 | 10/1978 | Monticelli et al. | 250/214 C |

Primary Examiner—Stanley D. Miller
Assistant Examiner—B. P. Davis
Attorney, Agent, or Firm—Oblon, Fisher, Spivak, McClelland & Maier

[57] ABSTRACT

A bias circuit accurately compensates temperature coefficient of an optical multiplication in an avalanche photodiode with low power consumption. Temperature coefficient voltage for compensating temperature coefficient of the multiplication of the photodiode is delivered from an emitter follower added a constant voltage to an input of an operational amplifier. The output of the operational amplifier is added, via a voltage regulating diode, to a base of a transistor of which emitter and collector are respectively connected to a terminal of the photodiode and a negative power source. Emitter voltage of the transistor is dividedly connected to another input terminal of the operational amplifier, wherein this connection is negative feedback. The temperature coefficient voltage generated at the emitter follower is amplified inversely proportional to the divided ratio of the emitter voltage of the transistor in order to compensate the temperature coefficient of the multiplication of the photodiode. A voltage across the photodiode can be adjusted by adjusting the constant voltage added to the emitter follower. Voltage drifts caused by temperature variations in the negative feedback loop including the operational amplifier, the voltage regurating diode, the transistor and the voltage divider are entirely eliminated with the negative feedback operation.

4 Claims, 3 Drawing Figures 4,730,128

BIAS CIRCUIT FOR AN AVALANCHE PHOTODIODE

BACKGROUND OF THE INVENTION

1. Field of the Invention

The present invention relates to a bias circuit for an avalanche photodiode.

The invention is particularly concerned with a bias circuit for making an avalanche photodiode operate stably.

2. Description of the Prior Art

An avalanche photodiode is employed as an element receiving a faint optical signal in fields of optical communication and optical measurement.

The avalanche photodiode is applied reverse voltage which is slightly less than its breakdown voltage, so that receiving an optical signal, optical multiplication (3 to 100) is obtainable by the avalanche phemonenon. The larger the optical multiplication is, the slighter optical signal is receivable. Many improvements have accordingly been done in order to obtain stably the higher optical multiplication.

The voltage which is slightly less than the breakdown voltage of the avalanche photodiode is required in order to obtain large optical multiplication. However, the reverse current of the avalanche photodiode increases abruptly with a little increase of the reverse voltage in adjacencies of the breakdown voltage so that optical multiplication increases, too. Accordingly, the larger optical multiplication is required, the slighter fluctuation of the reverse voltage the same is chamged with. In such a case, the avalanche photodiode may be damaged by the abrupt increase of the reverse current.

Such changes of the optical multiplication and the reverse current can also be caused by variations of the environmental temperature, even if the applied reverse voltage is constant.

There is shown in FIG. 1 a prior art bias circuit to deal with such a problem.

In FIG. 1, 11 indicates an avalanche photodiode of which cathode is connected to a base of a common emitter type transistor of the first stage in a signal amplifier 13. When an optical signal 12 is applied to the avalanche photodiode 11, an electrical signal multiplied with the avalanche phenomenon is obtained at the cathode of the avalanche photodiode 11. The electrical signal is amplified by the signal amplifier 13 connected to the cathode of the avalanche photodiode 11.

Numeral 17 identifies an operational amplifier, 24 and 25 denote transistors, 41 to 46 designate resistors and 53 represents a potentiometer.

The transistor 24, the resistors 43 to 46 and the potentiometer 53 construct a constant current source. The collector current of the transistor 24 flows to a negative power source $-V_D$ through the resistors 42 and 41.

The avalanche photodiode 11 is made of silicon, for instance, which is applied with reverse voltage of 130 volts being slightly less than the breakdown voltage. The resistance of the resistor 42 is 10 megohms, for instance, and the collector current of the transistor 24 is about 13 microamperes, so that the negative feedback loop consisting of the operational amplifier 17, the transistor 25 and the resistor 42 operates to keep the anode voltage of the avalanche photodiode 11 –130 volts.

In case the optical multiplication is constant, the fluctuations of the breakdown voltage of the avalanche photodiode 11 caused by fluctuations of the environmental temperature are about 0.1% of the breakdown voltage a centigrade degree (130 mV/a centigrade degree).

The fluctuations of the voltage $V_{EB}$ between the emitter and the base of the transistor 24 are $-2.5$ millivolts a centigrade degree, too.

In case the environmental temperature rises, the voltage $V_{EB}$ of the transistor 24 decreases, so that the collector current increases and the voltage drop across the resistor 42 increases, too. The voltage at the point in which resistor 42 and the operational amplifier 17 are connected is fixed to zero volts with the operation of the negative feedback loop consisting of the operational amplifier 17, the transistor 25 and the resistor 42. Therefore, the voltage at the point connected with the resistor 42 and the avalanche photodiode 11 increases toward minus. In such a manner, the optical multiplication is kept constant by increasing slightly the reverse voltage of the avalanche photodiode 11 of which optical multiplication decreases a little by the environmental temperature rising up.

A dividing ratio of the emitter current of the transistor 24 through the resistor 44 can be adjusted with the potentiometer 53. By such means, a rate of change of the voltage between the emitter and the base of the transistor 24 is adjustable.

The voltage in adjacencies of the breakdown voltage of the avalanche photodiode 11 is obtained by the voltage drop across the resistor 42 through which the collector current of the transistor 24 flows.

The voltage drop across the resistor 42 must be a large voltage (e.g. 130 V). It is therefore required that resistance of the resistor 42 is large or current (the collector current of the transistor 24) through the resistor 42 is large.

In an optical time domain reflectometer (OTDR) employing necessarily such an avalanche photodiode for measuring disconnection and other problems of optical fibers, for instance, low power consumption is generally required because the OTDR is frequently used with battery operation in outdoor measurement of fiber cables during a long time. The more the collector current of the transistor 24 is increased, the more the transistor 24 itself generates heat. Therefore, the temperature characteristic of the voltage between emitter and the base of the transistor 24 is undesirably influenced by not only the environmental temperature but the heat generated by the transistor 24 itself. If the collector current of the transistor 24 is 13 microamperes and the resistance of the resistor 42 is 10 megohms, the reverse voltage of 130 volts is obtainable across the resistor 42.

If a resistor 42 having high resistance (e.g. 10 megohms) is employed, its temperature coefficient is not better than the same having low resistance.

In the prior art, there have, therefore, been problems that the temperature compensation of the avalanche photodiode has not been obtained enough by the temperature coefficient of the resistor 42.

However, a resistor having good temperature coefficient has not been employed as the resistor 42, because of increasing the generation of heat in the transistor 24 and the power comsumption as above-mentioned.

SUMMARY OF THE INVENTION

An object of the present invention is to provide an improved circuit for biasing an avalanche photodiode.

Another object of the invention is to provide a bias circuit for accurately compensating the temperature coefficient of optical multiplication in an avalanche photodiode with little power consumption.

According to an aspect of the present invention, a temperature coefficient voltage for compensating the temperature coefficient of optical multiplication of an avalanche photodiode is delivered to an input of an operational amplifier from an emitter of an emitter follower which has a constant voltage applied to its base. The output of the operational amplifier is added, via a voltage regulating diode, to a base of a transistor of which emitter and collector are respectively connected to a terminal of the avalanche photodiode and a negative power source. Emitter voltage of the transistor is dividedly connected to another input of the operational amplifier, wherein this connection is negative feedback.

The temperature coefficient voltage generated at the emitter follower is amplified inversely proportional to the divided ratio of the emitter voltage of the transistor in order to compensate the temperature coefficient of the optical multiplication of the avalanche photodiode.

A voltage across the avalanche photodiode can be adjusted by adjusting the constant voltage added to the emitter follower.

In such an operation, voltage drifts caused by temperature variations in the negative feedback loop including the operational amplifier, the voltage regulating diode, the transistor and the voltage divider are entirely eliminated by the negative feedback operation.

BRIEF DESCRIPTION OF THE DRAWINGS

The principle, construction and operation of the present invention will be clearly understood from the following detailed description taken in conjunction with the accompanying drawings, in which.

DESCRIPTION OF THE PREFERRED EMBODIMENTS

Figure 2:
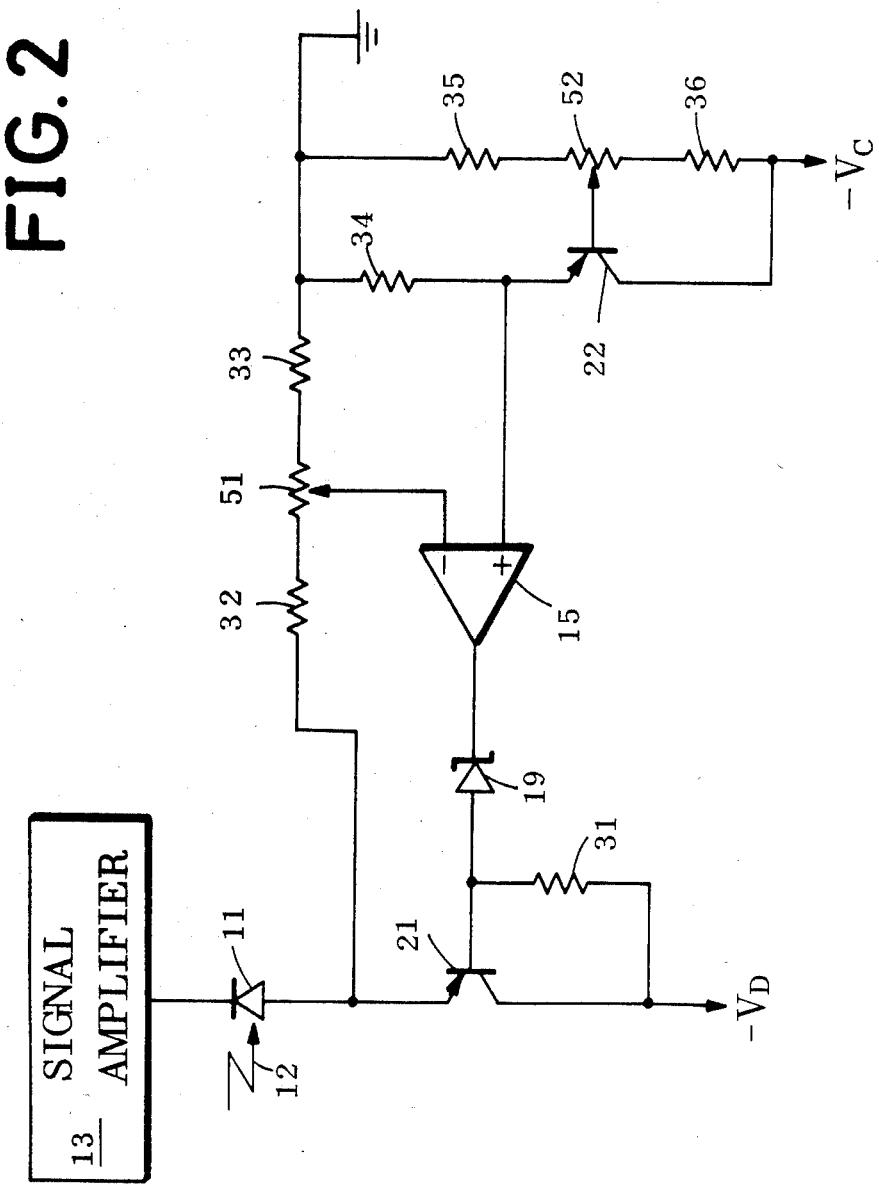
FIG. 2 is a circuit diagram of a bias circuit in accordance with the present invention.

With reference to FIG. 2 showing an embodiment of the present invention constructed as a bias circuit for an avalanche photodiode, reference numeral 11 indicates an avalanche photodiode of which cathode is connected to the first stage in a signal amplifier 13. When an optical signal 12 is applied to the avalanche photodiode 11, an electrical signal multiplied by the avalanche phenomenon is obtained at the cathode of the avalanche photodiode 11. The electrical signal is amplified by the signal amplifier 13 connected to the cathod of the avalanche photodiode 11.

Numeral 15 denotes an operational amplifier, 19 designates a voltage regulating diode, 21 and 22 represent transistors, 31 to 36 show resistors and 51 and 52 refer to potentiometers.

The transistor 22 constructs an emitter follower of which base voltage is adjusted with the potentiometer 52 and the resistors 35 and 36. The voltage across the resistor 34 plus the voltage between the emitter and the base of the transistor 22 equals the base voltage of the transistor 22.

The voltage between the emitter and the base of the transistor 22 is drifted with temperature variation, so that a noninverting input voltage of the operational amplifier 15 is varied and compared with an inverting input voltage of the same to amplify the differential voltage between those input voltages.

The amplified differential voltage is transmitted to the base of the transistor 21 via the voltage regulating diode 19, so that the emitter voltage of the transistor 21 is varied.

The voltage variation of the emitter of the transistor 21 is divided to one nth by voltage dividing means which consists of the potentiometer 51 and the resistors 32 and 33. The divided voltage is applied to the inverting input terminal of the operational amplifier 15, whereby the negative feedback operation is effectively obtained. The current from the voltage regulating diode 19 flows in resistor 31, and $-V_C$ and $-V_D$ are negative power sources.

The transistor 21 feeds the voltage applied its base to the avalanche photodiode 11 and bypasses the current through the avalanche photodiode 11.

The anode voltage of the avalanche photodiode 11 is adjusted to the voltage of n times the input voltage at the noninverting input terminal of the operational amplifier 15. The base voltage of the transistor 22 minus the voltage between the emitter and the base of the transistor 22 equals the input voltage at the noninverting input terminal.

If the voltage between the emitter and the base of the transistor 22 decreases a little, its variation is amplified by n times. The amplified variation is applied to the anode of the avalanche photodiode 11 of which anode voltage is increased toward the negative direction. Thus the reverse voltage across the avalanche photodiode 11 is increased. Therefore, the optical multiplication factor which is apt to decrease by environmental temperature rising up is kept constant with the control.

Voltage variations caused by temperature characteristics in the voltage regulating diode 19 and the transistor 21 which are included in the negative feedback loop are perfectedly eliminated from the anode voltage of the avalanche photodiode 11 by the effect of the negative feedback.

Figure 1:
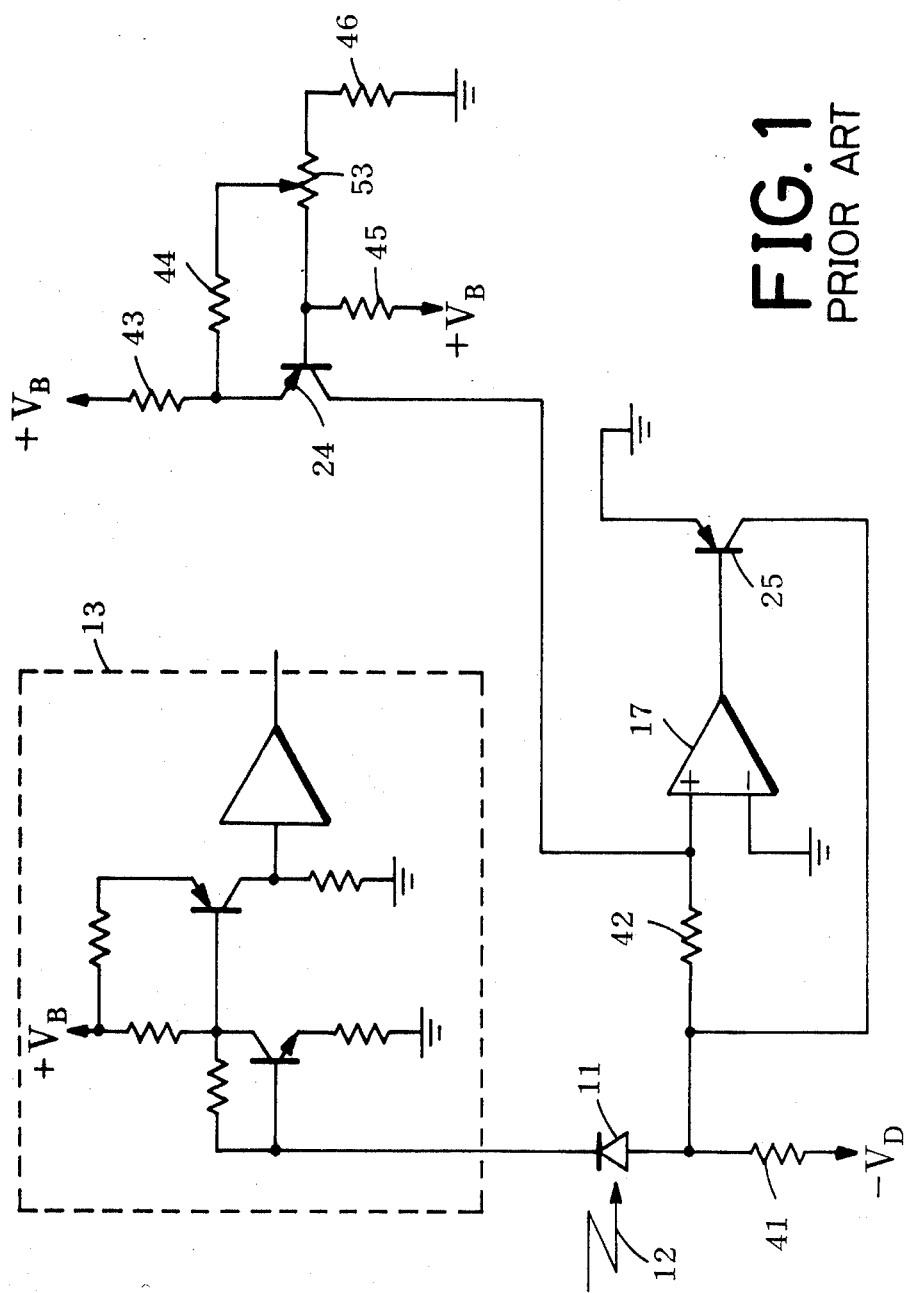
FIG. 1 is a circuit diagram of a bias circuit of the prior art.

The resistances of the resistors 32 and 33 and the potentiometer 51 being lower than the same of the resistor 42 shown in FIG. 1 are employable. However, even if high resistances are employed, in case the temperature coefficients of the resistors 32 and 33 and the potentiometer 51 are equal to each other, unfavorable effects do not result, and the excellent temperature characteristics are obtainable.

Figure 3:
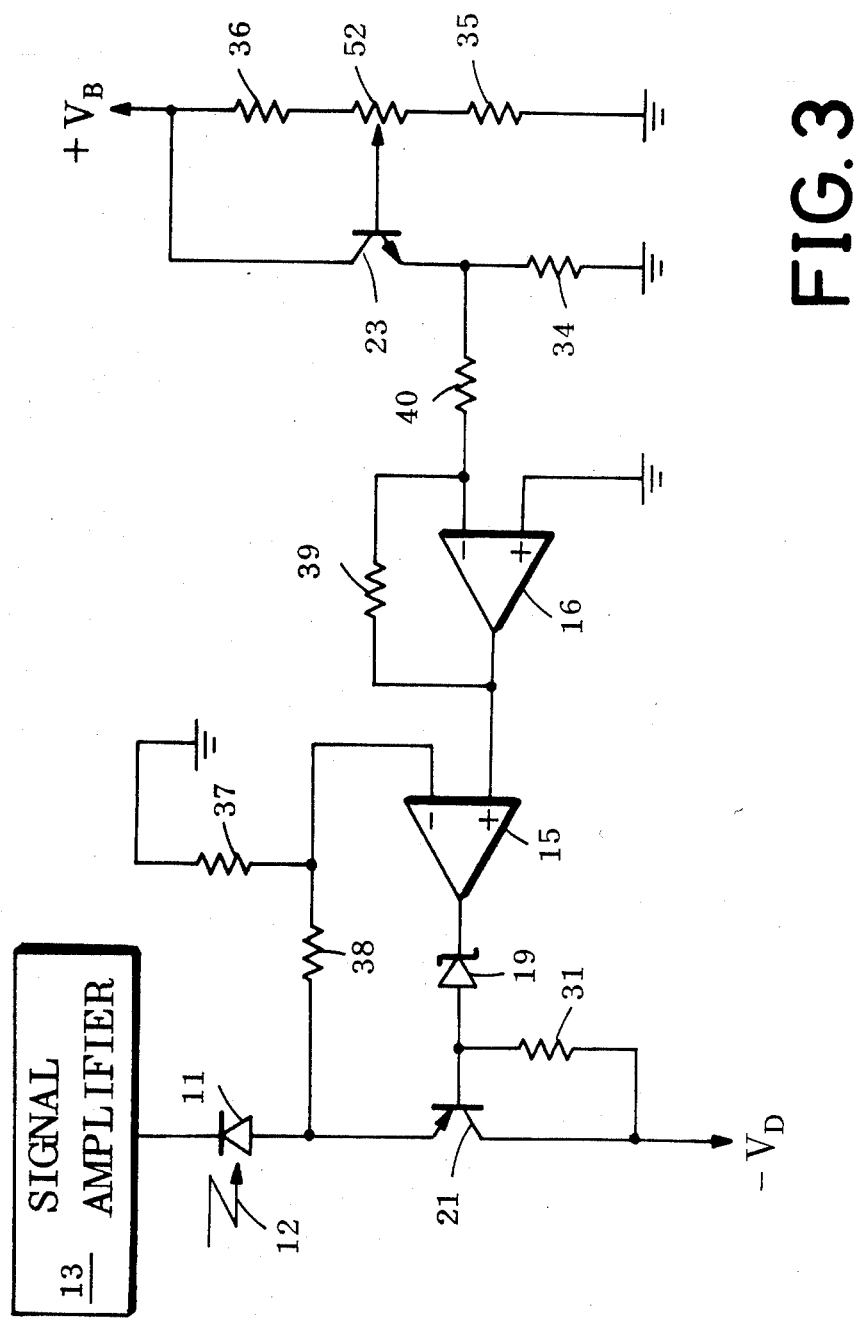
FIG. 3 is another circuit diagram of a bias circuit in accordance with the present invention.

Another modified embodiment is shown in FIG. 3, wherein those elements which are identical to those of FIG. 2 are denoted by the same numeric symbols as used therein.

There are a few differences from the circuit of FIG. 1 such as an inverting amplifier consisting of an operational amplifier 16 and resistors 39 and 40 is appended, therefore the negative power source $-V_C$ is replaced by the positive power source $+V_B$, and the PNP transistor 22 is replaced by the NPN transistor 23.

The inverting amplifier consisting of the operational amplifier 16 and the resistors 39 and 40 amplifies the output of the emitter follower including the transistor 23. The output of the emitter follower includes the voltage depending on the temperature coefficient of the voltage between the base and the emitter of the transistor 23.

The output of the inverting amplifier including the operational amplifier 16 is applied to a noninverting input of the operational amplifier 15 which operates as comparator to feed out the bias voltage to the avalanche photodiode 11 via the voltage regulating diode 19 and the transistor 21.

If a variable resistor is employed as the resistor 39, the amplification factor of the inverting amplifier is adjustable.

In case of employing such an inverting amplifier, even if the amplification factor of the comparator including the operational amplifier 15, the resistors 38 and 37, and so forth is smaller than that shown in FIG. 2, such a comparator is obviously employable.

The voltage regulating diode 19 is employed in FIGS. 2 and 3 for obtaining the great voltage difference between the output terminal of the operational amplifier 15 and the base of the transistor 21. If an operational amplifier 15 which can feed out a great enough voltage can be employed, the voltage regulating diode 19 can be eliminated.

The bias voltage is applied to the anode of the avalanche photodiode 11 in FIGS. 2 and 3, however it is obvious that the bias voltage can be applied to the cathode of the same, too.

The signal amplifier 13 as shown in FIG. 1 is illustratively employed respectively in FIGS. 2 and 3. However the signal amplifier 13 is not essential in the present invention, therefore, it is obvious that any amplifier can be employed as the signal amplifier 13.

The output signal from the avalanche photodiode 11 to the signal amplifier 13 is illustratively obtained at the cathode in FIGS. 2 and 3. However it is obvious that the output signal can be obtained at the anode of the avalanche photodiode, too.

As has been described hereinbefore, according to the present invention, in a bias circuit of an avalanche photodiode, low power consumption and stabilized photo multiplication which eliminates undesirable effects caused by temperature variations are effectively obtainable.

While the preferred embodiments of the present invention have been described, it is to be understood that modifications will be apparent to those skilled in the art without departing from the spirit of the invention.

What is claimed is:

1. A bias circuit of an avalanche photodiode comprising:
    temperature coefficient voltage means including an emitter follower with a constant voltage applied to a base for obtaining a temperature coefficient voltage at an emitter to compensate a temperature coefficient of variation of an optical multiplication factor in an avalanche photodiode;
    voltage dividing means for obtaining a voltage divided from a biasing voltage at a terminal of said avalanche photodiode of which another terminal is connected to an input of a signal amplifier;
    a transistor of which emitter is connected to said terminal of said avalanche photodiode for bypassing current of said avalanche photodiode and of which collector is connected to a voltage source; and
    comparing means for receiving and comparing said divided voltage obtained from said voltage dividing means with said temperature coefficient voltage generated in said temperature coefficient voltage means and received by said comparing means to obtain an amplified error voltage which is applied to a base of said transistor.

2. A bias circuit of an avalanche photodiode according to claim 1, wherein said temperature coefficient voltage means obtains said temperature coefficient voltage via an amplifying means included therein which amplifies an output of said emitter follower.

3. A bias circuit of an avalanche photodiode according to claim 1, wherein said comparing means includes an operational amplifier for comparing said divided voltage obtained from said voltage dividing means with said temperature coefficient voltage obtained by said temperature coefficient voltage means to obtain said amplified error voltage which is applied to said base of said transistor.

4. A bias circuit of an avalanche photodiode according to claim 1, wherein said comparing means includes an operational amplifier for comparing said divided voltage obtained from said voltage dividing means with said temperature coefficient voltage obtained by said temperature coefficient voltage means to obtain said amplified error voltage which is applied to said base of said transistor via at least a voltage regulating diode included therein.

* * * * *